Figure 1:
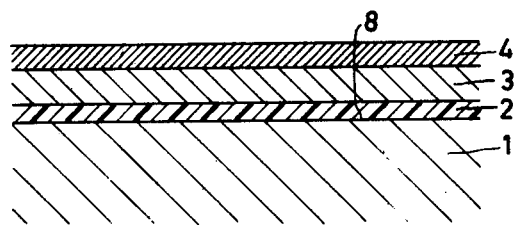

United States Patent [19]

Wilting

[11] 4,373,251
[45] Feb. 15, 1983

[54] METHOD OF MANUFACTURING A SEMICONDUCTOR DEVICE

[75] Inventor: Hermanus J. H. Wilting, Eindhoven, Netherlands

[73] Assignee: U.S. Philips Corporation, New York, N.Y.

[21] Appl. No.: 294,268

[22] Filed: Aug. 19, 1981

[30] Foreign Application Priority Data

Aug. 27, 1980 [NL] Netherlands .................. 8004835

[51] Int. Cl.³ .......................................... H01L 21/22
[52] U.S. Cl. .................................. 29/571; 29/590; 148/187
[58] Field of Search .................. 29/571, 590; 148/187, 148/1.5

[56] References Cited

U.S. PATENT DOCUMENTS

| | | | |
|---|---|---|---|
| 3,590,471 | 7/1971 | Lepselter et al. | 29/571 |
| 3,617,824 | 11/1971 | Shinoda et al. | 148/187 X |
| 3,881,242 | 5/1975 | Nuttall et al. | 29/589 X |
| 3,967,981 | 6/1976 | Yamazaki | 148/1.5 |
| 4,063,901 | 12/1977 | Shiba | 148/188 X |
| 4,180,596 | 12/1979 | Crowder et al. | 29/591 X |
| 4,276,688 | 7/1981 | Hsu | 29/571 |
| 4,285,761 | 8/1981 | Fatula et al. | 29/590 |
| 4,304,042 | 12/1981 | Yeh | 29/571 |
| 4,319,395 | 3/1982 | Lund et al. | 29/571 |

Primary Examiner—G. Ozaki
Attorney, Agent, or Firm—Paul R. Miller

[57] ABSTRACT

An undoped polycrystalline silicon layer 6 is provided on an electrically insulating layer 2 at the surface 8 of a semiconductor body 1 and a metal layer 4, for example of molybdenum, is provided on layer 6. After heating to convert part of layer 3 into a metal silicide layer 5 a dopant, for example phosphorus, is introduced into the polycrystalline layer 4 through layer 5. This method can be used to make an insulated gate field effect device where the gate comprises a double layer structure of metal silicide on polycrystalline silicon.

6 Claims, 3 Drawing Figures

METHOD OF MANUFACTURING A SEMICONDUCTOR DEVICE

The invention relates to a method of manufacturing a semiconductor device, including the steps of providing an electrically insulating layer on a surface of a semiconductor body, providing a polysilicon layer on the insulating layer, which polysilicon layer is made electrically conductive by the introduction of a dopant, providing a metal layer or the polysilicon layer and subjecting the metal layer together, with the polysilicon to a thermal treatment in which the polysilicon layer is converted over a part of its thickness into a metal silicide layer by reaction with the metal of the metal layer.

The invention is particularly although not exclusively concerned with an improved method of manufacturing an insulated gate field effect device.

An insulated gate field effect device consisting of a double layer structure of a doped polysilicon layer and a metal silicide layer is already known, for example, from U.S. Pat. No. 4,080,719.

Such a double layer structure has many advantages. For example, it can be given a much lower resistivity than doped polysilicon layers alone. Moreover fewer impurities are present at the interface between the doped polysilicon layer and the insulating layer than at the interface between the undoped polysilicon layer and the insulating layer.

With the double layer structure having a doped polysilicon layer, the threshold voltage of field effect devices can be better controlled than in a double layer structure with an undoped polysilicon layer.

A gate electrode with a double layer structure with a doped polysilicon layer is conventionally manufactured as follows. A surface of a semiconductor body is provided with an electrically insulating layer, a doped polysilicon layer on the insulating layer, and a metal layer on the doped polysilicon layer. The metal layer together with the doped polysilicon layer is subjected to a thermal treatment in which the polysilicon layer is converted over a part of its thickness into a metal silicide layer by reaction with the metal of the metal layer.

A metal silicide layer can be made by reacting, for example, a sputtered or vapour-deposited layer of metal, for example, molybdenum, with a layer of polysilicon at 600°–900° C.

The metal silicide layer, the polysilicon layer and the electrically insulating layer can then be masked and delineated to form a gate of an insulated gate field effect device. The polysilicon layer may be doped with, for example, phosphorus and the metal layer may be, for example molybdenum. In practice, however, during said thermal treatment, the phosphorus-doped polysilicon layer reacts insufficiently with the molybdenum layer, so that said phosphorus-doped polysilicon layer, over the part of its thickness which is to be converted into molybdenum silicide, is not completely converted.

This insufficient reaction was concluded from the findings that, even after the proper thermal treatment was applied to a molybdenum layer and a phosphorus-doped polysilicon layer, the molybdenum layer still retains its metallic colour, does not show the bluish colour of molybdenum silicide and is easily soluble in nitric acid (HNO$_3$).

Probably a kind of intermediate layer is formed on the surface of said phosphorus-doped pllysilicon layer which cannot be removed with hydrofluoric acid (HF).

It is an object of the invention to avoid at least to a considerable extent the above-mentioned difficulty which is possibly caused by said intermediate layer.

According to the invention, a method having the steps mentioned in the opening paragraph is characterized in that, after converting the polysilicon layer over a part of its thickness into the metal silicide layer, the dopant is introduced through the metal silicide layer into the remaining part of the polysilicon layer.

The invention is based on the recognition that a sufficient metal silicide formation and a constant threshold voltage can be achieved by reaction of the metal layer with an undoped polysilicon layer and by introducing a dopant into an undoped polysilicon layer through a metal silicide layer.

The dopant easily passes through the metal silicide layer by usual doping techniques, such as diffusion. Preferably the dopant is phosphorus, boron or arsenic. When the dopant is phosphorus it may be introduced from a gas flow containing phosphine (PH$_3$) or phosphorus oxychloride (POCl$_3$) at a temperature between 900° and 1000° C. The metal may be titanium, tantalum, tungsten or molybdenum. If the metal is molybdenum, the thermal treatment is preferably performed at a temperature between 600° and 900° C.

Figure 2:
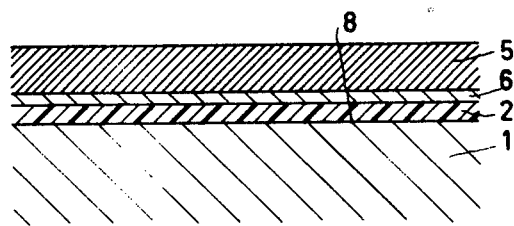
Figure 3:
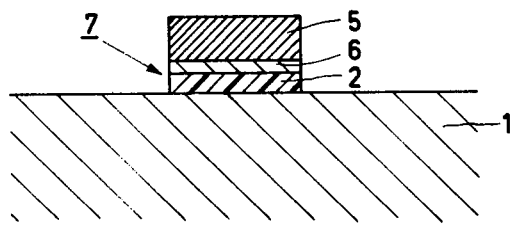

An embodiment of the invention will now be described, by way of example, with reference to the accompanying drawing. In the drawing, FIGS. 1 to 3 are diagrammatic sectional views of a part of a semiconductor device at successive stages of its manufacture using a method in accordance with the invention. Corresponding parts are generally referred to by the same reference numerals.

Referring to FIGS. 1 to 3, a method of manufacturing an insulated gate field effect transistor is described. The starting material is a semiconductor body 1, in this example a silicon wafer 1, which is p-type conductive.

A surface 8 of the silicon wafer 1 is provided with an electrically insulating layer 2 by using any usual method, e.g., an approximately 500 Å thick layer of silicon oxide 2 is provided by thermal oxidation.

A polysilicon layer 3 is deposited on said insulating layer 2 to a thickness of about 3,500 Å by decomposition of a gaseous silicon compound, which polysilicon layer is to be made electrically conductive by the introduction of a dopant.

A metal layer 4, in this example consisting of molybdenum, is then provided over the whole surface of the polysilicon layer, to a thickness of about 750 Å.

Then, the metal layer 4, together with the polysilicon layer 3, is subjected to a thermal treatment (FIG. 2). For example, in the case that the metal is the 750 Å thick molybdenum, the thermal treatment is performed at a temperature between 600° and 900° C. for 60 minutes in an inert or reducing atmosphere, in which the polysilicon layer 3 is converted over a part of its thickness into a molybdenum silicide layer 5 by reaction with the molybdenum of the molybdenum layer.

During the thermal treatment, in this example the molybdenum metal layer 4 on top of the polysilicon layer 3 is converted entirely into the molybdenum silicide layer 5 to a thickness of 3,000 Å, while a very thin undoped polysilicon layer 6, in this example of about 400–500 Å thickness, of the undoped polysilicon layer 3 still remains under the molybdenum silicide layer 5.

After converting the polysilicon layer 3 over a part of its thickness into the metal silicide layer 5 a dopant is introduced through the metal silicide layer 5 into the remaining part 6 of the polysilicon layer. The dopant, for example phosphorus, is introduced into the remmaining thin undoped polysilicon layer 6 through the molybdenum silicide layer 5 to obtain a doped polysilicon layer 6 from a gas flow containing phosphine ($PH_3$) or phosphorus oxychloride ($POCl_3$) by a thermal treatment at a temperature between 900° and 1000° C. for approximately 10 minutes or by ion implantation in a usual way.

The insulated gate 7 is now obtained by patterning layers 2, 6 and 5 with conventional photolithographic etching methods (FIG. 3).

During the manufacturing processes, the two abovementioned thermal treatments for providing a metal silicide layer and for introducing a dopant can be carried out as a single thermal treatment at a temperature between 900° and 1000° C.

That the metal silicide layer 5 is molybdenum silicide ($MoSi_2$) is confirmed by X-ray analysis and measurement of the resistivity. The metal silicide layer has a buish colour.

The semiconductor body is further subjected to usual treatments in order to complete the field effect device.

The invention is not restricted to the example described, but may also be used in other polysilicon gate MOS transistor processes, for example in the manufacture of C-MOS transistors. In particular, annular MOS transistors with good properties can be made using a method in accordance with the invention.

In the above-mentioned manufacturing processes, a different metal may be used, for example, titanium, tantalum or tungsten, and a different dopant may be used, for example boron or arsenic.

A method in accordance with this invention has the advantage that the double layer structure of a thin doped polysilicon layer and a metal silicide layer for a gate electrode of a MOS transistor can easily and reproducibly be provided. The threshold voltage of the transistor is characteristic of the dopant used.

What is claimed is:

1. A method of manufacturing a semiconductor device, including the steps of providing an electrically insulating layer on a surface of a semiconductor body, providing a polysilicon layer on the insulating layer which polysilicon layer is made electrically conductive by the introduction of a dopant, providing a metal layer on the polysilicon layer, and subjecting the metal layer together with the polysilicon layer to a thermal treatment in which the polysilicon layer is converted over a part of its thickness into a metal silicide layer by reaction with the metal of the metal layer, characterized in that, after converting the polysilicon layer over a part of its thickness into the metal silicide layer, the dopant is introduced through the metal silicide layer into the remaining part of the polysilicon layer.

2. A method as claimed in claim 1, characterized in that said dopant is phosphorus, boron or arsenic.

3. A method as claimed in claim 2, characterized in that said dopant is phosphorus and is introduced from a gas flow containing phosphine ($PH_3$) or phosphorus oxychloride ($POCl_3$) by a thermal treatment at a temperature between 900° and 1,000° C.

4. A method as claimed in any of the claims 1, 2, or 3, characterized in that said metal is titanium, tantalum, tungsten or molybdenum.

5. A method as claimed in claim 4, characterized in that said metal is molybdenum and the thermal treatment to obtain the metal silicide layer is performed at a temperature between 600° and 900° C.

6. A method as claimed in claim 4, characterized in that thermal treatments to obtain the metal silicide layer and to introduce the dopant are carried out as a single thermal treatment at a temperature between 900° and 1,000° C.

* * * * *